United States Patent
Mascarenhas et al.

(10) Patent No.: US 9,287,431 B2
(45) Date of Patent: Mar. 15, 2016

(54) SUPERSTRATE SUB-CELL VOLTAGE-MATCHED MULTIJUNCTION SOLAR CELLS

(71) Applicant: Alliance for Sustainable Energy, LLC, Golden, CO (US)

(72) Inventors: Angelo Mascarenhas, Lakewood, CO (US); Kirstin Alberi, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 16 days.

(21) Appl. No.: 14/243,320

(22) Filed: Apr. 2, 2014

(65) Prior Publication Data

US 2014/0209149 A1    Jul. 31, 2014

Related U.S. Application Data

(63) Continuation-in-part of application No. PCT/US2012/068761, filed on Dec. 10, 2012.

(51) Int. Cl.
| | |
|---|---|
| *H01L 31/00* | (2006.01) |
| *H01L 31/18* | (2006.01) |
| *H01L 31/0687* | (2012.01) |
| *H01L 31/05* | (2014.01) |
| *H01L 31/0725* | (2012.01) |

(52) U.S. Cl.
CPC ........ *H01L 31/0687* (2013.01); *H01L 31/0504* (2013.01); *H01L 31/0725* (2013.01); *Y02E 10/544* (2013.01)

(58) Field of Classification Search
CPC ............ H01L 31/0687; H01L 31/0725; H01L 31/0504; Y02E 10/544
See application file for complete search history.

(56) References Cited

U.S. PATENT DOCUMENTS

| | | | |
|---|---|---|---|
| 5,261,969 A | * | 11/1993 | Stanbery ...................... 136/249 |
| 5,853,497 A | | 12/1998 | Lillington et al. |

(Continued)

FOREIGN PATENT DOCUMENTS

| | | |
|---|---|---|
| EP | 2375455 | 10/2011 |
| WO | 2007/040594 | 4/2007 |

(Continued)

OTHER PUBLICATIONS

Barnett et al., "50% Efficient Solar Cell Architectures and Designs", Photovoltaic Energy Conversion, Conference Record of the 2006 IEEE 4th World Conference on Photovoltaic Energy Conversion, May 2006, pp. 2560-2564.

(Continued)

*Primary Examiner* — Matthew Martin
(74) *Attorney, Agent, or Firm* — Suzanne C. Walts

(57) ABSTRACT

Voltage-matched thin film multijunction solar cell and methods of producing cells having upper CdTe pn junction layers formed on a transparent substrate which in the completed device is operatively positioned in a superstate configuration. The solar cell also includes a lower pn junction formed independently of the CdTe pn junction and an insulating layer between CdTe and lower pn junctions. The voltage-matched thin film multijunction solar cells further include a parallel connection between the CdTe pn junction and lower pn junctions to form a two-terminal photonic device. Methods of fabricating devices from independently produced upper CdTe junction layers and lower junction layers are also disclosed.

19 Claims, 5 Drawing Sheets

(56) References Cited

U.S. PATENT DOCUMENTS

| | | |
|---|---|---|
| 7,095,050 B2 | 8/2006 | Wanlass et al. |
| 8,067,687 B2 | 11/2011 | Wanlass |
| 8,173,891 B2 | 5/2012 | Wanlass et al. |
| 2005/0056312 A1 | 3/2005 | Young et al. |
| 2006/0144435 A1 | 7/2006 | Wanlass |
| 2009/0242029 A1* | 10/2009 | Paulson et al. ............... 136/260 |
| 2010/0031994 A1 | 2/2010 | Varghese |
| 2010/0059101 A1* | 3/2010 | Shinohara ..................... 136/244 |
| 2010/0059109 A1 | 3/2010 | Nakayashiki et al. |
| 2010/0078056 A1* | 4/2010 | Hovel .......................... 136/244 |
| 2010/0096001 A1 | 4/2010 | Sivananthan et al. |
| 2010/0116337 A1* | 5/2010 | Eaglesham .......... H01L 27/302 |
| | | 136/260 |
| 2010/0170556 A1 | 7/2010 | Frolov et al. |
| 2010/0236615 A1 | 9/2010 | Sharps |
| 2010/0263713 A1 | 10/2010 | Ludowise |
| 2011/0023958 A1 | 2/2011 | Masson et al. |
| 2011/0232731 A1 | 9/2011 | Namkoong et al. |
| 2012/0152322 A1 | 6/2012 | Kribus et al. |
| 2012/0180854 A1 | 7/2012 | Bellanger et al. |
| 2013/0192656 A1 | 8/2013 | Hardin et al. |
| 2013/0240027 A1 | 9/2013 | Zakhidov et al. |

FOREIGN PATENT DOCUMENTS

| | | |
|---|---|---|
| WO | 2011/124321 | 10/2011 |
| WO | 2012/018649 | 2/2012 |
| WO | 2012/082772 | 6/2012 |
| WO | 2012/173619 | 12/2012 |
| WO | 2013/043809 | 3/2013 |

OTHER PUBLICATIONS

Carmody, "High Efficiency Single Crystal CdTe Solar Cells", Solar Energy Technologies Program Peer Review, U.S. Department of Energy—Energy Efficiency & Renewable Energy, May 2010, accessed at http://www1.eere.energy.gov/solar/review_meeting/pdfs/prm2010_epir.pdf, pp. 1-25.

Dimroth et al., "High-Efficiency Multijunction Solar Cells", MRS Bulletin, Mar. 2007, vol. 32, pp. 230-235.

Mohammad et al., "The Effects of Fabrication Prameters and Electroforming Phenomenon on CdTe/Si (p) Heterojunction Photovoltaic Solar Cell", Circuits and Systems, 2012, vol. 3, No. 1, pp. 42-47.

Xiao et al., "Modeling of CdZnTe/CdTe/Si Triple Junction Solar Cells", Photovoltaic Specialists Conference (PVSC), 37th IEEE, Jun. 2011, pp. 001386-001389.

International Search Report and Written Opinion for International (PCT) Application No. PCT/US2012/068761, mailed Feb. 14, 2013, pp. 1-10.

* cited by examiner

SUPERSTRATE SUB-CELL VOLTAGE-MATCHED MULTIJUNCTION SOLAR CELLS

CROSS REFERENCES

The present application is a continuation-in-part of International Application No. PCT/US12/68761 filed on Dec. 10, 2012, the contents of which are incorporated by reference in their entirety.

CONTRACTUAL ORIGIN

The United States Government has rights in this invention under Contract No. DE-AC36-08GO28308 between the United States Department of Energy and Alliance for Sustainable Energy, LLC, the manager and operator of the National Renewable Energy Laboratory.

BACKGROUND

In general, semiconductor-based photonic devices, such as photovoltaic cells (PV cells) include a junction formed between p-type and n-type conductivity regions in a semiconductor body. These conductivity regions generate a voltage potential and/or a current across the junction when electron-hole pairs are created in the semiconductor body in response to photons impinging upon the photovoltaic cell. When a load is connected between the p-type and n-type conductivity regions, an electric current will flow, thus producing power. PV cells therefore provide power from a renewable source, which is an attractive alternative to non-renewable energy sources.

The power conversion efficiency of a PV cell consisting of a single pn junction, referred to as a single junction solar cell, depends on the voltage that can be generated by the pn junction and the ability of the semiconductor(s) comprising the pn junction to absorb a significant portion of the solar spectrum. A semiconductor with a relatively larger bandgap energy can generate a large voltage, but photons having energies less than the bandgap energy are not absorbed by the semiconductor, and the generated current is relatively low. Likewise, a semiconductor with a relatively smaller bandgap energy can absorb a large portion of the solar spectrum and generate a high current, but photon energy in excess of the bandgap energy is lost to thermal energy, and the output voltage of the single junction solar cell is low.

Combining multiple pn junctions within a PV cell to form what is referred to as a multijunction solar cell can reduce the tradeoffs between voltage and current generation in a single junction solar cell and increase the energy conversion efficiency of the device. In a multijunction solar cell, the pn junctions are typically arranged in a vertically stacked configuration. The pn junctions may be stacked either through physical bonding or mechanical stacking of individual pn junctions that have been grown on separate substrates, or through monolithic integration of the pn junctions on one substrate. Each pn junction is designed to absorb a portion of the photons in the solar spectrum while passing photons with energy less than the bandgap energy to the pn junction(s) situated below. The use of multiple pn junctions in a multijunction solar cell therefore reduces thermalization losses. Multijunction solar cells therefore typically have efficiencies that are higher than single junction solar cells.

The manner in which the pn junctions that make up the multijunction solar cell are electrically connected together determines the voltage and current output of the device. A single pn junction solar cell can be partitioned by subdividing it into multiple units of individual PV cells arranged laterally, referred to as sub-cells. If the sub-cells are electrically connected in series, their voltages add, and the lowest current-producing sub-cell determines the overall current output of the device. If the sub-cells are electrically connected in parallel, the currents of each of the sub-cells add, and the voltage will be limited to an intermediate voltage between the highest and lowest values produced by any of the sub-cells. Multijunction solar cells may utilize one or both of these electrical connection configurations.

Conventional multijunction solar cells are configured such that vertically-stacked pn junctions are connected in series. These devices are typically referred to as current-matched multijunction solar cells because the individual pn junctions are usually designed to have the same current output. In a monolithically integrated device, the electrical connections between adjacent pn junctions are made with a tunnel junction. The tunnel junction is an ultrathin pn junction composed of heavily doped high bandgap energy p-type conductivity and n-type conductivity regions (heavily doped being defined herein as dopant concentrations of greater than about $10^{18}$ $cm^{-3}$). From a manufacturing standpoint, tunnel junctions present a convenient way to "hard-wire" connections between vertically-stacked pn junctions, but achieving adequately high doping concentrations is difficult or impossible in many semiconductor materials. This is particularly true for many thin film semiconductors that are used in polycrystalline single junction and multijunction solar cells.

Voltage-matched multijunction solar cell designs can circumvent some of the limitations of current-matched designs. Variations in the solar spectrum throughout the day can have a large impact on the current that is output by individual pn junctions, but spectral variations will have a much smaller impact on the voltage output. Therefore, the performance of voltage-matched multijunction solar cells suffers less from diurnal spectral variations than current-matched multijunction solar cells. Moreover, tunnel junctions are not required between vertically-stacked pn junctions in a voltage matched design. This is advantageous when designing multijunction solar cells utilizing semiconductors in which it is difficult to achieve heavily doped ultrathin layers. The primary disadvantage of voltage-matched multijunction solar cells, however, is the need for more complex intra-cell electrical connections. Sub-cells formed within the same pn-junctions are typically connected in series, forming a sub-cell string, and the strings from the different vertically stacked pn-junctions are then connected in parallel. The number of sub-cells in each of the strings need not necessarily be the same and are chosen so that the voltage outputs of all of the strings match. Isolating and connecting sub-cells in pn junctions that are buried within monolithically-integrated multijunction solar cell stacks is challenging because it usually requires physical removal of material from overlying pn junctions in order to access buried pn junctions. In these cases, fabrication requires multiple etch and growth steps, which can add to the cost of the solar cell module. It also necessarily constrains the geometry and layout of the sub-cells in each pn junction layer.

Polycrystalline or amorphous thin film solar cells, including cadmium telluride (CdTe), copper indium gallium selenide (sulfide) (CIGS), copper zinc tin sulfide (CZTS), polycrystalline or microcrystalline silicon (Si) and amorphous Si (a-Si) architectures, have many advantages over crystalline Si or III-V solar cell technologies. For example, polycrystalline or amorphous thin film designs feature relatively lower overall material usage as compared to crystalline silicon cells, and the ability to fabricate cells on large area glass substrates with atmospheric deposition techniques reduces manufacturing and module costs. One trade-off is that single junction polycrystalline and/or amorphous designs have comparatively lower conversion efficiencies than their crystalline Si or III-V counterparts.

Multijunction solar cell designs incorporating thin film materials would capitalize on inexpensive processing costs while providing an avenue to increased efficiencies over single junction polycrystalline or amorphous thin film solar cells. Thin film solar cell designs featuring monolithically integrated structures in which the individual vertically stacked pn junctions are connected in series require that the output of these individual pn junctions be substantially current matched. As noted above, this requirement necessitates that tunnel junctions are formed between the monolithically grown vertically stacked pn junctions to facilitate current flow. However, difficulty in achieving heavily doped ultrathin layers in thin film materials impedes the formation of low resistance tunnel junctions making the production of thin film current matched solar cells problematic. Furthermore, the complexity of processing steps required by known prior-art voltage matched approaches (whether monolithic or mechanically stacked) makes known voltage matched solar cell technologies costly and thus unattractive.

The embodiments disclosed herein are intended to overcome one or more of the limitations described above. The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment includes a voltage-matched multijunction solar cell having a first (upper) crystalline, polycrystalline or amorphous pn junction formed on a transparent substrate which is implemented in a superstrate configuration, and an independently formed second (lower) crystalline, polycrystalline or amorphous pn junction. In this embodiment, the first pn junction and the second pn junction of the solar cell have a transparent electrically insulating layer located between the junction layers, and the first pn junction and second pn junction are connected in parallel to form a two-terminal photonic device. In certain embodiments the upper pn junction comprises CdTe junction layers and the lower pn junction comprises crystalline Si junction layers.

The voltage-matched solar cell may include front contacts and back contacts associated with each pn junction accessible from the surface of each pn junction opposite the transparent electrically insulating layer. The contacts may be implemented with a transparent conducting oxide, a metal or by other means. The transparent superstrate may consist of but is not limited to a glass substrate, or a clear flexible substrate. The crystalline, polycrystalline or amorphous pn junctions may comprise at least one of; CIGS, CZTS, a-Si, polycrystalline Si, microcrystalline Si, thin c-Si, CdTe, or CdTe alloyed with Zn, Se or S. The voltage-matched thin film multijunction solar cell may also include a first string of serially connected sub-cells defined within the first crystalline, polycrystalline or amorphous pn junction voltage matched to a second string of serially connected sub-cells defined within the second crystalline, polycrystalline or amorphous pn junction. The first string is configured so that the substrate is positioned above the first sub-cell string so that the first string connects to the second string in a superstrate configuration.

One alternative embodiment comprises a voltage-matched thin film multijunction solar cell having a bottom pn junction formed from a doped Si, Ge or GaAs wafer, interdigitated p-type and n-type back contacts associated with the bottom pn junction and an insulating layer in contact with the bottom cell, opposite the back contacts. The voltage-matched thin film multijunction solar cell also includes an upper pn junction, a front contact and a back contact wherein the upper pn junction is separated from the bottom pn junction by an insulating layer and wherein the upper pn junction has a superstrate configuration with a substrate above the upper pn junction, and the bottom pn junction and the upper pn junction are connected in parallel to form a two-terminal photonic device. In this embodiment, the front and back contacts associated with the upper pn junction are accessible from the front surface of the top cell and may comprise a transparent conducting layer, for example, transparent conducting oxide layers or a metal grid layer. In selected embodiments, the upper pn junction is a crystalline, polycrystalline or amorphous thin film CdTe upper junction. The crystalline, polycrystalline or amorphous upper pn junction may comprise layers of at least one of; CIGS, CZTS, a-Si, polycrystalline Si, microcrystalline Si, CdTe, or CdTe alloyed with Zn, Se or S. The bottom pn junction may further comprise a thin crystalline Si pn junction having a thickness of less than 80 micrometers.

Alternative embodiments include methods of fabricating the solar cells disclosed herein.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

Figure 1:
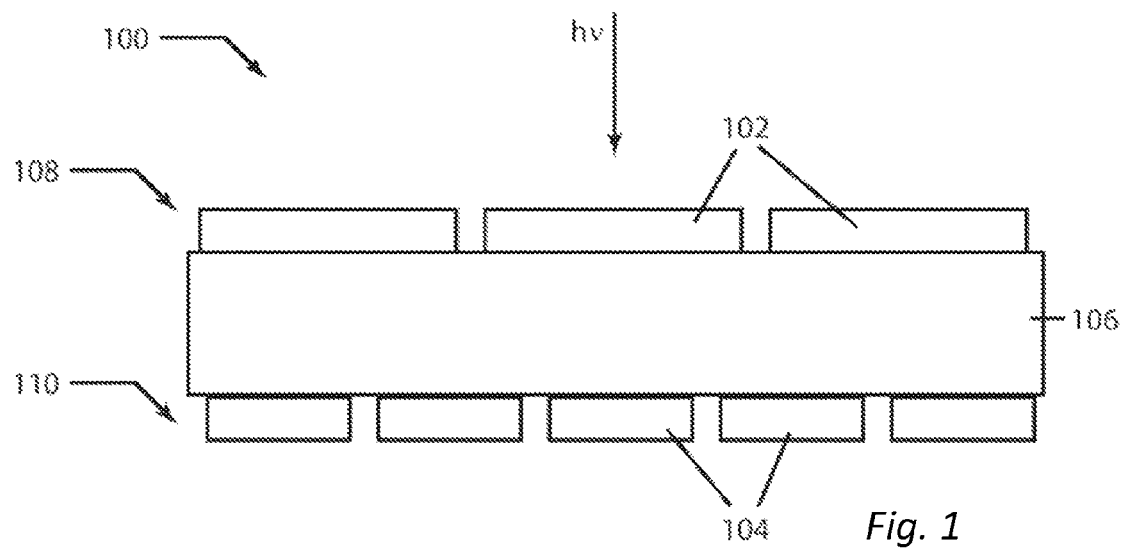
FIG. 1 is a simplified schematic illustration of a tandem voltage-matched solar cell as disclosed herein.

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "element" or "component" encompass both elements and components comprising one unit and elements and components that comprise more than one unit unless specifically stated otherwise. A material may be described herein as being "single crystalline", "multicrystalline" or "polycrystalline". Single crystalline very specifically means an ingot, wafer or epilayer that is truly a single crystal, with no grain boundaries. "Crystalline" is a more general term for a substantially crystalline material which can have grain boundaries. "Multicrystalline" refers to a crystalline material with a small number of large crystalline grains. "Polycrystalline" refers to crystalline material comprised of a large number of small crystalline grains. The orientation of individual grains can be arbitrary and the individual grains are separated by grain boundaries. The term single crystalline does not mean absolutely defect free. Single crystalline material will have defects and/or dislocations. Certain abbreviations may be made herein with respect to the description of semiconductor alloys. These abbreviations shall not be construed as limiting the scope of the disclosure or claims. For example, the form "InGaAlN" is a common abbreviation to improve readability in technical manuscripts. Abbreviated forms such as "InGaAlN" are defined as equivalent to an expanded form, for example; "$In_xGa_yAl_{1-x-y}N$".

Multijunction (MJ) solar cells present the one option for significantly increasing absolute module efficiency beyond the single junction Schockley Queisser limit of 32%. Combining different, low cost PV technologies (i.e. Si, CdTe, CIGS, etc) within an MJ solar cell could provide an alternative way to improve PV module efficiencies as well as keep manufacturing costs and complexity down. Specifically, combining crystalline, polycrystalline or amorphous Si and polycrystalline CdTe or other thin-film cells as described in detail below is advantageous because these are the most widely used PV technologies and therefore benefit from the greatest knowledge and manufacturing bases. Si/thin film combination therefore present one of the best possibilities for achieving a levelized cost of electricity that is comparable to conventional energy sources, while being manufactured on a large scale. Incorporating these materials into a current-matched MJ solar cell configuration, however, is impractical because it is difficult to form a high performance tunnel junction between, for example tandem CdTe and Si solar cells. The current-matching constraint also limits the design of the top and/or bottom sub-cells, potentially lowering the overall performance of the device.

The embodiments disclosed herein provide a way to overcoming these limitations by combining CdTe and Si pn junctions (or other materials as described below) in a MJ solar cell by using a "voltage-matched" configuration. FIG. 1 shows the general architecture of a voltage-matched MJ (VMMJ) device 100. Arrays of sub-cells delineated from the same absorber layer pn junction are serially connected into strings and are separated from those of the other absorber layer pn junction by an insulating barrier. The number of sub-cells in each string is engineered such that they output the same voltage (i.e. $n_1V_1=n_2V_2$), and the strings are connected in parallel to form a two terminal device. The sub-cell dimensions can range from centimeters to several inches. The VMMJ design has the advantages that no tunnel junction is needed to connect the sub-cells, and the sub-cell geometry does not need to be adjusted to achieve current-matching requirements. Due to the diodes logarithmic I-V relationship, the output of VMMJ solar cells is also less sensitive to diurnal variations in the solar spectrum and intensity.

Known monolithically-integrated voltage-matched multijunction solar cells typically consist of a platform that includes many pn junctions vertically stacked on top of a common substrate. Access to underlying pn junctions for sub-cell isolation and contact formation therefore often occurs in a top-down approach. According to some manufacturing and deposition plans, isolation and metallization steps are designed to occur after each pn junction is deposited or added. According to other fabrication methods, all of the layers are first deposited or added, and trenches are etched through one or more upper pn junctions in order to access underlying layers and pn junctions. These approaches necessarily require a number of intricate processing steps that are costly. These approaches also can introduce limitations in the geometrical configuration of the sub-cells in each pn junction and the way that the sub-cells are electrically connected.

As noted above, many multijunction solar cells are designed as monolithically integrated structures in which the individual pn junctions are connected in series and are current matched. This strategy requires that heavily doped tunnel junctions be formed between the pn junctions to facilitate current flow. However, difficulty in achieving heavily doped ultrathin layers in thin film materials impedes the formation of low resistance tunnel junctions if thin film pn junctions are included in a current matched vertical stack. One way to overcome this problem is to fabricate the multijunction solar cell in a voltage-matched configuration, for which parallel connections are made between the sub-cell strings that lie in different pn junctions. No tunnel junctions are needed, and the multijunction solar cells, typically fabricated with the individual pn junctions having selected bandgaps as noted herein, exhibit a greater insensitivity to spectral variations over the course of the day. In addition, the additive voltages within a sub-cell string enables lower current densities at a given power output. In concentrator applications, this feature is of special value as it facilitates lower sheet current densities in the contact layers and therefore lower $I^2R$ losses.

The various embodiments more specifically disclosed herein concern the design and fabrication of monolithically integrated multijunction solar cells in which strings of serially connected sub-cells having approximately equal output voltages are fabricated from two or more vertically stacked pn junctions which are connected in parallel. FIG. 1 illustrates one possible embodiment 100 consistent with the principles disclosed herein. First and second pn junctions 102 and 104 respectively are separated by an electrically insulating transparent layer 106. The pn junctions each consist of n-type and p-type conductivity regions and the electrical junction between them. One region (p-type or n-type) is referred to as the emitter, and the other region (n-type or p-type) is referred to as the absorber. The materials for the pn junctions are chosen such that the bandgap energy of the semiconductor(s) comprising the first pn junction 102 is greater than the bandgap energy of the semiconductor(s) comprising the second pn junction 104. The pn junction 102 is operationally positioned to face the sun and is therefore alternatively referred to as the "upper," "front" or "top" junction herein. The bandgap energy of the material comprising the insulating layer 106 is also greater than that of the pn junction 104 and is equal to or greater than that of pn junction 102. Therefore, photons with energies less than the bandgap energy of the pn junction 102 pass through the pn junction 102 and insulating layer 106 to pn junction 104. In the device design of FIG. 1, one set of serially electrically connected sub-cell strings 108 is comprised of sub-cells fabricated from pn junction 102 and the other set of serially electrically connected sub-cell strings 110 is comprised of sub-cells fabricated from pn junction 104. Because the sub-cell voltage is a function of the bandgap energy of the semiconductor(s) comprising the pn junction, the number of serially connected sub-cells in each string is chosen such that the sum of sub-cell voltages in all of the strings in each pn junction is approximately equal.

Figure 2:
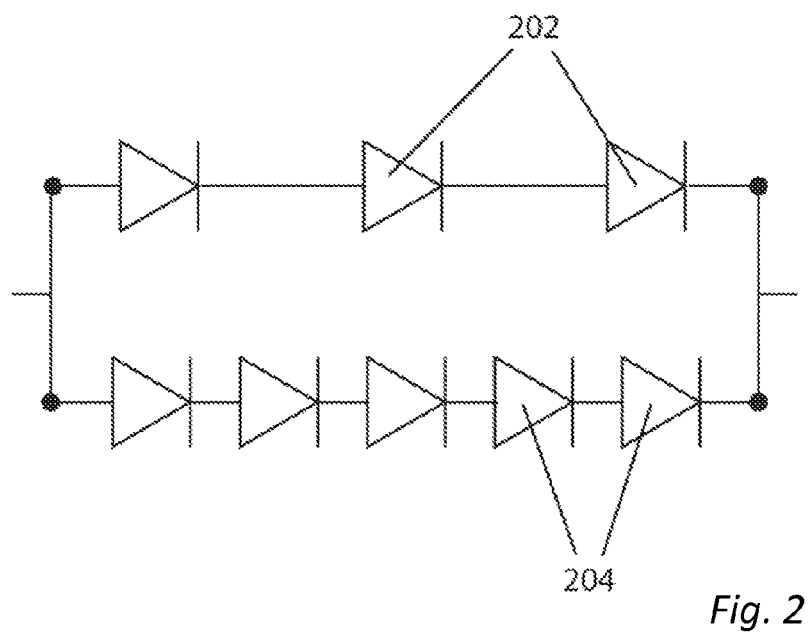
FIG. 2 is a schematic illustration of the electrical connections between the sub-cells illustrated in FIG. 1.

The serial electrical connections among sub-cells may be made in the following manner. All electrical connections within the sub-cell strings 108 in the top pn junction 102 are fabricated from the top side of the device. All electrical connections of the sub-cell strings 110 in the bottom pn junction 104 are fabricated from the backside of the device. The top sub-cell strings and bottom sub-cell strings are then connected in parallel to form a two terminal device. The general configuration of the electrical connections of the sub-cells depicted in FIG. 1 is illustrated schematically in FIG. 2, where the diodes 202 and 204 represent sub-cells in junctions 102 and 104 respectively. The precise sub-cell layout, electrical contact arrangement and fabrication processes will vary depending on the specific configuration and materials used in the monolithic tandem voltage-matched solar cell 100. The pn junctions may be fabricated from the substrate material, or grown on the substrate, or grown on a different substrate and subsequently transferred to the substrate used for the final monolithic tandem voltage-matched solar cell 100. Substrates may include, but are not limited to, a semiconductor wafer, glass or another optically transparent material. Processing steps may include, but are not limited to, sub-cell isolation through chemical etching, laser scribing or mechanical scribing, material removal to expose and make electrical contact to a buried contact layer and patterning electrically conducting and electrically insulating layers. The electrically conducting layers may consist of a metal, a transparent conducting oxide or other conducting material, among other choices. The insulating layers may consist of an un-doped semiconductor, oxide, nitride or other materials with high electrical resistance. High resistivity or isolating diodes can also be used for electrical isolation of the two stacked pn junctions. These insulating layers need to be transparent to light.

There are several benefits to the general monolithic tandem voltage-matched solar cell design 100 presented in FIG. 1. One advantage is that the formation or interconnection of sub-cell strings within one pn junction layer can occur independently of the formation or interconnection of sub-cell strings within the other pn junction layer. No material removal from the top pn junction 102 is needed to access the underlying pn junction layer 104 for processing. Additionally, the geometric configuration of sub-cells fabricated within the top pn junction layer 102 is not dependent on the geometric configuration of the sub-cells fabricated within the bottom pn junction layer 104 or vice versa. Many single junction solar cells are also already fabricated such that all of the electrical contacts are made either from the front or from the back of the device. This is true of many thin film single junction solar cells grown on glass in a substrate or superstrate configuration as well as Si wafer-based single junction solar cells fabricated with all back or interdigitated back contacts. The present monolithic tandem voltage-matched solar cell design approach allows for the use of established processing routines with very little alteration.

Figure 3:
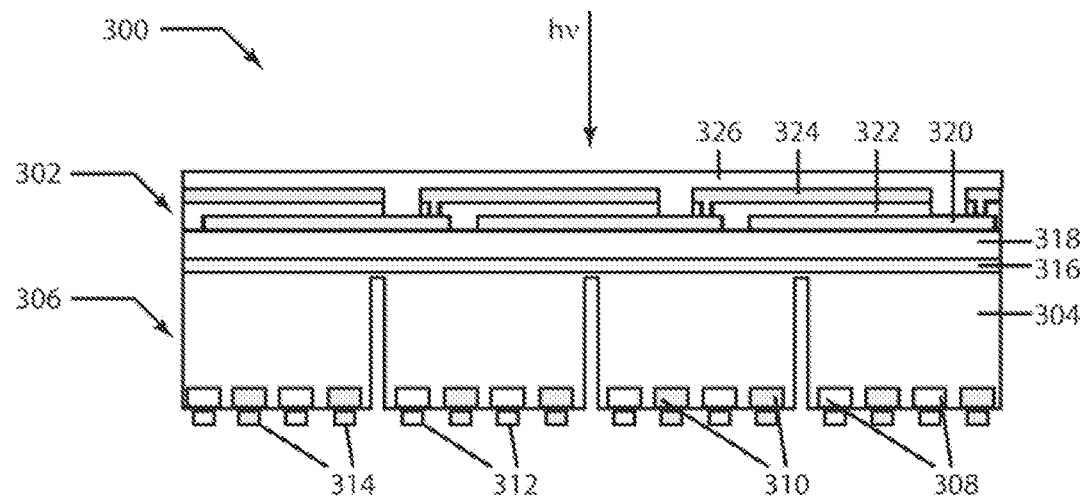
FIG. 3 is a schematic illustration of a tandem voltage-matched solar cell as disclosed here.

Another embodiment of a voltage-matched monolithic solar cell is shown in FIG. 3. The FIG. 3 embodiment includes a monolithic tandem voltage-matched solar cell 300 which can be fabricated from a polycrystalline or amorphous thin film pn junction, such as CIGS, CZTS, a-Si, polycrystalline Si, microcrystalline Si, CdTe, or CdTe alloyed with Zn, Se or S, grown on or attached to a Si wafer-based pn junction. Strings of sub-cells 306 are formed in the lightly p-type (or n-type) doped Si wafer 304 using an all back or interdigitated back contact configuration, in which all contacts are made on the back side of the Si wafer 304. For example, heavily n-type doped regions (or heavily p-type doped regions) 308 are patterned onto the backside of the Si wafer to form the emitter regions. Electrical connection to the lightly p-type doped (or lightly n-type doped) Si absorber region may also be facilitated though the patterning of local regions 310 of heavy p-type (or n-type) doping on the backside of the Si wafer as well. Doping of regions 308 and 310 may be achieved through a number of approaches including, but not limited to, dopant diffusion from Si inks, pastes or liquid dopant sources, ion implantation or amorphous Si deposition. The heavily doped regions 308 and 310 are not restricted to any particular shape.

Metal contacts 312 and 314 are formed in contact with the doped regions 308 and 310, respectively. Laser scribing, among other options, may be used to carry out sub-cell isolation. Texturing one or both sides of the Si wafer may be implemented to improve light absorption in the Si sub-cells. A heavily doped layer 316 with the same conductivity type as the lightly doped Si wafer may also be included on the top side of the Si wafer in order to reduce carrier recombination at that interface. This may also be achieved by processes including, but not limited to, dopant diffusion from Si inks, pastes or liquid dopant sources, or ion implantation, or amorphous Si deposition.

Electrical isolation of the bottom Si and the upper polycrystalline or amorphous sub-cell strings is achieved by forming an electrically insulating layer 318 on top of the Si wafer. This layer may be composed of an oxide or nitride material, an un-doped semiconductor or another electrically insulating and optically transparent material. The electrical insulating layer 318 may also consist of a high resistivity layer or isolating diode. Alternatively, low index of refraction layers could also be utilized in the electrical insulating layer 318 to enhance photon recycling and/or light trapping.

The upper polycrystalline or amorphous thin film pn junction is formed on top of the electrically insulating layer 318. The disclosed embodiments can be implemented with any of the existing polycrystalline or amorphous thin film single junction solar cell architectures, and fabrication of the sub-cell strings 302 from the pn junction 322 can follow existing processing methods and routines. For example, the structure may include a back contact layer 320, which may consist of, but not be limited to, a heavily doped semiconductor or a transparent conducting oxide that is transparent to photons with energies less than the bandgap energy of the polycrystalline or amorphous thin film material that comprises the pn junction of the top sub-cells. The contact layer 320 may be isolated into back contacts for individual sub-cells via laser scribing or chemical etching. The pn junction 322 may be formed on top of the back contact layer 320. The pn junction of each sub-cell may then be isolated through laser scribing, chemical etching or other means, such that an opening to the back contact layer 320 is formed. An electrically conducting layer 324 may then be deposited on top of the pn junction 322 to form the top contact as well as the electrical connection to the back contact of the adjacent sub-cell when they are to be serially electrically connected to form sub-cell strings 302. The top contact layer 324 should be deposited or formed from a material that has a higher bandgap than the pn junction 322 so that it is transparent to light absorbed in pn junction 322. For example, this material may include, but is not limited to, transparent conducting oxides. The top contact layer 324 may then be isolated between sub-cells via laser scribing, chemical etching or other means. Metal grids may also be used in conjunction with or in place of the top contact layer 324 to facilitate current collection from the top sub-cells. Metal contacts may also be used to connect adjacent sub-cells within a string. Finally, passive layers 326 may be deposited on top of the device to protect the top sub-cells. A similar layer could also be used on the back side of the device to passivate the bottom sub-cells if needed. Such layers could also incorporate a variety of photon recycling or light trapping configurations. Post-deposition treatments may be applied at any time during the processing to passivate defects in the polycrystalline or amorphous material and improve the overall performance of the sub-cells. The device structure may also include additional layers or features that are conventionally used to facilitate the performance of silicon or thin-film solar cells but are not shown in FIG. 3.

The use of a Si wafer to fabricate the bottom sub-cells has many advantages including but not limited to the following:

An interdigitated back contact (IBC) or other strategy which positions both the n-type contacts 312 and the p-type contacts 314 on the back side of the device (or away from the insulating layer 318) can be used to facilitate contacting and improve light absorption in the Si active layers. Implementation of an IBC can be carried out at low cost using Si ink technologies, which allow screen-printing of patterned n-type and p-type contacts in close proximity to one another. Dopant diffusion from pastes or liquid dopant sources, ion implantation or amorphous Si deposition could also be used to create regions of high doping for the IBC. In the IBC embodiment, isolation of the Si sub-cells can also occur from the back-side of the device, which will reduce the complexity of the isolation processing steps. A heavily doped layer 316 can also be incorporated into the Si sub-cells at the interface with the isolation layer 318 to reduce carrier recombination. Alternatively, transparent conducting layers and/or selective emitter technologies could be used to form the front contact of the Si active layers.

Planar or textured geometries can be used for the Si layers. The later improves the absorption of long wavelength light via light-trapping effects. A textured surface should also not significantly affect the subsequent deposition of the upper polycrystalline or amorphous pn junction layer.

The bandgap energies of the materials comprising the pn junctions in the monolithic tandem voltage-matched solar cells of FIG. 3 can span the range of 0.25 eV to 2.5 eV. However, the ideal combination of bandgap energies for a tandem solar cell under one sun illumination is approximately 1.1 eV and 1.7 eV. The bandgap energy of Si is near the ideal 1.1 eV value for a bottom sub-cell. A wafer of Ge or any other crystalline semiconductor may also be used in the place of a Si wafer for the bottom sub-cells, but this may increase the cost of the device. A number of polycrystalline or amorphous thin film materials may be used for the top sub-cells. CdTe (1.45 eV) has a bandgap energy that is slightly lower than the ideal value but would still be viable. CdTe may also be alloyed with Zn, Se or S to increase the bandgap energy. Other possible thin film materials may include, but are not limited to, polycrystalline CIGS (0.9-2.5 eV), CZTS (1.4-15. eV), a-Si (1.7 eV), or microcrystalline Si. These materials have the advantage that they do not need to be grown on a crystalline template, and no lattice-matching is required.

Thin single crystalline or large-grained multicrystalline semiconductor layers may also be utilized as the pn junction material for the top sub-cell strings in the embodiments shown in FIG. 3. Thin single crystalline or large-grained multicrystalline semiconductor layers may include, but are not limited to, $GaAs_xP_{1-x}$, $GaIn_xP_{1-x}$, GaAs, CdTe, CdSe, ZnTe, CIGS or CZTS. These crystalline pn junctions may be metamorphically grown directly on a crystalline electrically insulating layer 318 with the potential use of a compositionally-graded transitional buffer (CGTB) layer. A CGTB layer is designed to accommodate large differences in lattice constants between two crystalline materials that may cause defects by gradually shifting the lattice constant between the values of the electrically insulating material 318 and pn junction 322. The CGTB layer is designed to be transparent to light passing through the top pn junction 322 to the bottom pn junction. In this embodiment, the back contact layer 320 associated with the top pn junction 322 may also consist of a heavily doped single crystalline semiconductor. The CGTB layer may also be used between the top of the heavily doped layer in the bottom sub-cell wafer 316 and the electrically insulating layer 318, the electrically insulating layer 318 and the back contact layer 320, the back contact layer 320 and the pn junction 322 of the top sub-cells or any combination thereof. The single crystalline or large-grained multicrystalline pn junction 322 may also be grown on a different substrate designed to template crystalline growth and subsequently transferred and bonded to the final device structure. This allows for flexibility in choosing the materials of the electrically insulating layer 318 and back contact layer 320. Neither layer is required to be single crystalline or large-grained multicrystalline in this case. If these layers are implemented with single crystalline materials, however, they may be grown on the final device structure itself or on the same substrate that is used for the growth of the crystalline pn junction 322. A single crystalline or large-grained multicrystalline electrically insulating layer 318 or back contact layer 320 may also be grown on a different substrate entirely, in which case it also would have to be transferred and bonded to the final device structure. In addition, the pn junction 322 may consist of several pn junction layers connected in series via tunnel junctions instead of a single pn junction layer. The set of vertically stacked pn junctions that make up 322 would constitute a single sub-cell that would be serially connected to neighboring sub-cells in 322 in the same manner as outlined above for the case where the pn junction 322 consists of a single pn junction.

Figure 4:
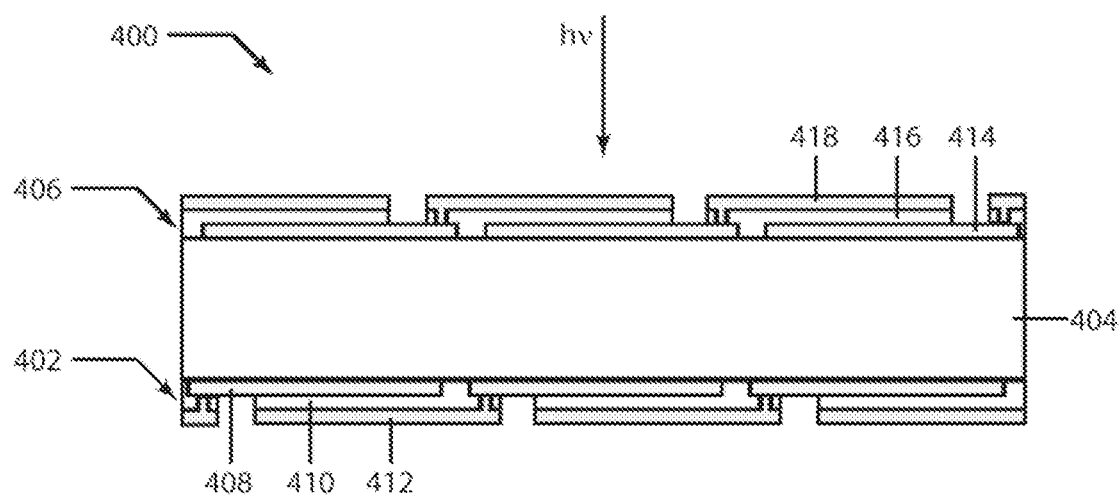
FIG. 4 is a schematic illustration of a tandem voltage-matched solar cell as disclosed herein.

In another embodiment, a monolithic tandem voltage-matched solar cell can be fabricated from two polycrystalline and/or amorphous thin film pn junctions separated by an electrically insulating substrate. A schematic representation of an example device design 400 is shown in FIG. 4. The bottom sub-cell strings 402 are configured in a superstrate design approach on a transparent substrate 404, while the top sub-cell strings 406 are configured in a substrate design approach on top of the transparent substrate 404. The bottom sub-cell string 402 has an associated transparent front contact layer 408 deposited on the backside of the transparent substrate 404. The bottom pn junction 410 is deposited on the front contact layer 408 and the bottom contact layer 412 is deposited on the bottom pn junction 410. Patterning, etching, or scribing of these layers may occur in any sequence during the fabrication of the bottom sub-cells. The bottom sub-cells are connected in series to form sub-cell strings with the desired number of sub-cells to achieve a required voltage. The top sub-cell strings 406 are formed from a transparent back contact layer 414, a pn junction 416 and a transparent front contact layer 418. Patterning, etching, or scribing of these layers may occur in any sequence during the fabrication of the top sub-cells. The top sub-cells are connected in series to form sub-cell strings with the desired number of sub-cells to achieve a required voltage.

The polycrystalline or amorphous materials grown or deposited to form the top and bottom pn junctions 416 and 410, respectively, may consist of, but are not limited to, CIGS, CZTS, CIS, a-Si, polycrystalline Si, microcrystalline Si, CdTe, or CdTe alloyed with Zn, Se or S. Both the transparent back contact layer 414 of the top sub-cells and the front contact layer 408 of the bottom sub-cells should be transparent to photons with energy less than those absorbed by the top pn junction 416. These layers may be fabricated from materials including but not limited to transparent conducting oxides. The transparent substrate 404 may be glass or any other material that is transparent to photons with energy less than those absorbed by the top pn junction 416. The transparent substrate 404 may act as the electrically insulating layer, or a separate electrically insulating layer may be deposited anywhere between the front contact 408 of the bottom pn junction and the back contact 414 of the top pn junction. As noted above, layers or configurations that support photon recycling and/or light trapping could also be incorporated into top and bottom sub-cells.

One advantage provided by a monolithic tandem voltage-matched solar cell 400 is that the polycrystalline or amorphous pn junction can be grown or deposited directly on an inexpensive and readily available substrate such as glass. This design provides the efficiency boost of integrating two polycrystalline or amorphous thin film single junction solar cells into a multijunction solar cell while maintaining a one sun, flat plate configuration with a relatively low module cost. Single crystalline or large-grained multicrystalline layers can also be used for the top pn junction 416, bottom pn junction 410 or both in this design by using layer transfer techniques. The crystalline pn junction can be grown on a single or multicrystalline template substrate. These layers can then be detached from the template substrate and bonded to the final device structure. This approach offers a greater selection of semiconductor materials in order to tune the bandgap energy or performance of the top and/or bottom sub-cells. The front and back contacts to each of the pn junctions may be made in any manner that is necessary for fabricating sub-cells out of crystalline pn junctions. This includes the sub-cell design, processing steps and material used for the top and bottom contacts. Metal grids may be used in place of or in addition to the low electrical resistivity front or back contact layers as required. All back contact or interdigitated back contact designs can also be used for the bottom sub-cells in this embodiment. Pn junction layers 416 and 410 could also comprise vertically stacked sets of pn junctions that are connected in series via tunnel junctions.

The various solar cell embodiments disclosed herein include voltage-matched multijunction solar cell designs and devices containing at least one polycrystalline or amorphous thin film pn junction layer. This enables several device design enhancements, including but not limited to:

- The ability to grow polycrystalline or amorphous thin films on non-crystalline surfaces allows for the use of non-crystalline transparent conducting contacts to be incorporated into the device stack.
- Elimination of the need for a crystalline growth template for the polycrystalline or amorphous thin film layers also allows for the incorporation of many different PV technologies and their associated efficiency-enhancing design improvements. This includes the use of inexpensive, non-crystalline substrates, such as glass, and light trapping features for embodiments that incorporate a crystalline Si pn junction. Eliminating the dependence on a crystalline growth template also obviates the need for thick CGTB layers and reduces the growth complexity and material usage in the device.
- In addition, the connection of pn junctions in parallel instead of series eliminates the need for heavily doped tunnel junctions, which is a major impediment to the development of thin film multijunction solar cells.

Certain VMMJ solar cell designs disclosed below incorporate a CdTe top pn junction and a bottom pn junction composed of bulk c-Si, thin film c-Si or another thin film material. In each case, the CdTe pn junction is assumed to be fabricated from a polycrystalline CdTe (absorber) and polycrystalline cadmium sulfide (CdS) (emitter/window layer). However, these layers could also be single crystalline. The Si pn junction is assumed to be crystalline (c-Si). This could be single crystalline, multicrystalline or polycrystalline in a wafer, thin layer, layer-transferred or other form. The Si emitter may be formed by any method, including high temperature dopant diffusion, c-Si epitaxy, or deposition of intrinsic and heavily doped amorphous Si layers (HIT cell design). Any suitable method or combination of methods for growing, depositing and/or fabricating the pn junction layers may be used. Likewise, the thin film bottom sub-cells can, in alternative embodiments, include a pn junction formed from polycrystalline thin film material(s) (i.e. CIGS, CZTS or another material) on a suitable substrate by any suitable fabrication method. The contacts can be formed from metal grids, transparent conducting materials or other contacting methods. The back contact of the bottom sub-cells may also be formed from a metal layer. The top contact of the CdTe sub-cells will typically be transparent to photons with energies above the CdTe bandgap, whereas the bottom contact of the CdTe sub-cells should primarily be transparent to photons with energies below the CdTe bandgap in order for this these photons to reach the underlying c-Si sub-cells. Contacts therefore can be formed from transparent conducting materials and/or metal grids that are designed to minimize optical shading. Likewise, the top contacts for the c-Si or thin film sub-cells (if used) should also be transparent and/or be designed to minimize optical shading losses. Any process of depositing or otherwise forming the contacts may be used. The transparent, electrically insulating barrier described in detail below, positioned between the top and bottom pn junctions, can be formed from any material and process that is suitable for that purpose. The insulating layer or layers between sub-cells may also be formed from a combination of materials that, in addition to being transparent and electrically insulating, also promote light trapping or light transmission.

Sub-cell stacking or integration may be carried out in two general approaches. Multiple sub-cells may be defined and interconnected within a single continuous pn junction layer, as depicted in FIG. 1. Sub-cell isolation may be performed by any suitable method, including dry or wet etching, laser scribing, mechanical scribing or other methods.

Figure 5:
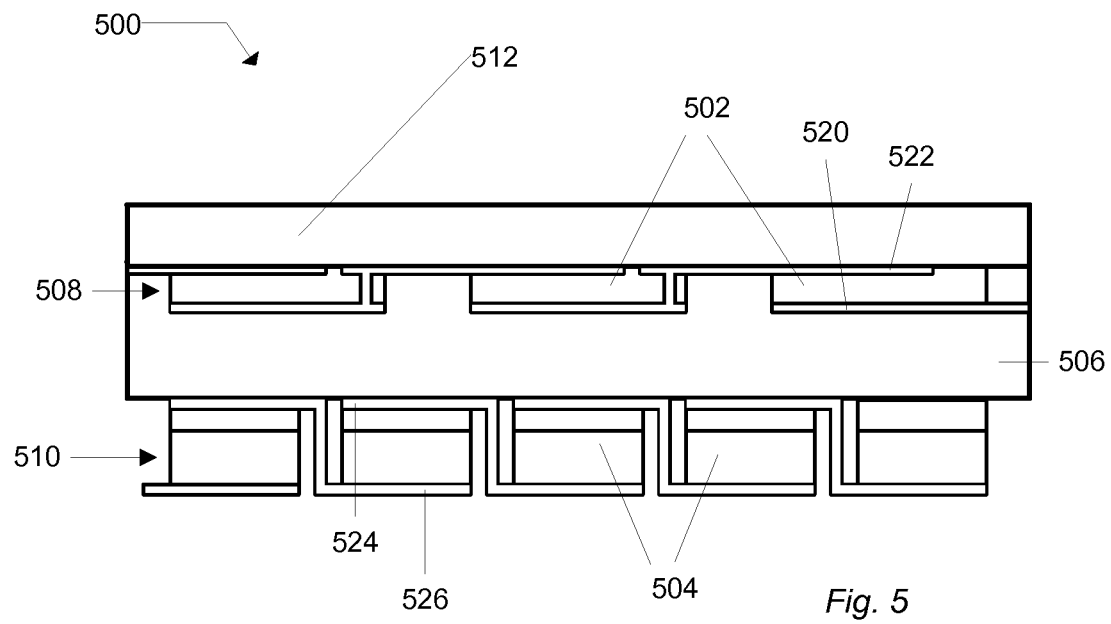
FIG. 5 is a schematic illustration of a tandem voltage-matched solar cell having a CdTe p-n junction formed in a superstrate configuration.

One particular embodiment of a voltage-matched multi-junction solar cell having CdTe upper pn junction layers and c-Si lower junction layers is shown in FIG. 5. The FIG. 5 embodiment includes upper junction layers prepared in a superstrate configuration. More particularly, the FIG. 5 embodiment is a tandem voltage-matched multijunction solar cell 500 fabricated from upper sub-cells defined within a set of polycrystalline thin film CdTe pn junction layers 502, such as CdTe, or CdTe alloyed with Zn, Se or S, grown on a transparent substrate 512. The Si pn junction layers 504 are formed independently from the CdTe pn junctions 504. When the device is assembled, CdTe and Si pn junctions 502 and 504 respectively are separated by an electrically insulating transparent layer 506. The voltage-matched multijunction solar cell 500 is structurally similar to solar cell 100 of FIG. 1, one difference being that the CdTe (upper) pn junction 502 is formed independently from the Si (lower) pn junction 504 with the respective sub-cells being joined into a device 500 in a subsequent step. Therefore, the CdTe pn junction 502 may be implemented for use in a superstrate configuration, and the Si pn junction 504 formed and implemented in a substrate configuration.

Specifically, the CdTe pn junction 502 may be formed on a separate transparent substrate 512, glass for example, subsequently inverted and bonded to the insulating layer above the top of Si pn junction 504. Therefore, the growth substrate 512 is positioned as an operational superstrate which in use faces the sun.

In the specifically illustrated configuration of solar cell 500, one set of serially electrically connected sub-cell strings 508 is comprised of CdTe sub-cells fabricated from CdTe pn junction 502 and the other set of serially electrically connected sub-cell strings 510 is comprised of Si sub-cells fabricated from Si pn junction 504. Because the sub-cell voltage is a function of the bandgap energy of the semiconductor(s) comprising the pn junctions 502 and 504, the number of serially connected sub-cells in each string is chosen such that the sum of sub-cell voltages in all of the strings in each pn junction is approximately equal.

The serial electrical connections among sub-cells may be made in the following representative, but non-limiting manner. All electrical connections within the sub-cell strings 508 in the CdTe pn junction 502 are fabricated on transparent substrate 512. All electrical connections of the sub-cell strings 510 in the Si pn junction 504 are fabricated on a separate substrate. Each of the CdTe sub-cells of sub-cell string 508 is serially connected, and each of the Si sub-cells of sub-cell string 510 is serially connected. The top sub-cell strings 508 and bottom sub-cell strings 510 are then connected in parallel to form a two terminal device.

The precise sub-cell layout, electrical contact arrangement and fabrication processes utilized will vary depending on the specific configuration and materials used in the tandem voltage-matched multijunction solar cell 500. As noted above, the CdTe pn junction 502 may be fabricated on transparent substrate 512. Si pn junction 504 is independently fabricated from a separate substrate, or grown on a separate substrate and subsequently transferred to the tandem voltage-matched multijunction solar cell 500. In some embodiments, the Si pn junction 504 may be prepared separately, transferred and subsequently bonded to the transparent electrically insulating layer 506. Alternatively, the transparent electrically insulating layer 506 may be grown on one of the Si pn junction 504 or CdTe sub-cell string 508 and then bonded to the other sub-cell as a fabrication step.

Substrates useful for either the upper or lower sub-cells may include, but are not limited to, a semiconductor wafer, glass, a polymer or another material which is optically transparent and which may be rigid or flexible. Processing steps may include, but are not limited to, sub-cell isolation through chemical etching, laser scribing or mechanical scribing, material removal to expose and make electrical contact to a buried contact layer and patterning electrically conducting and electrically insulating layers. The electrically conducting layers may consist of a metal, a transparent conducting oxide or other conducting material, among other choices. The insulating layers, such as transparent electrically insulating layer 506, may consist of an un-doped semiconductor, oxide, nitride, polymer or other material with high electrical resistance and optical transparency at suitable wavelengths. High resistivity or isolating diodes can also be used for electrical isolation of the two stacked pn junctions.

There are several benefits to the use a CdTe pn junction in a superstrate configuration, as shown in FIG. 5. One advantage noted above, is that the CdTe pn junction can be formed independently from the Si pn junction. This prevents the sub-cells of one PV technology from being exposed to the processing and fabrication conditions of the other. Additionally, the pn junctions may be formed in parallel with each other, thus simplifying the manufacturing process of having to create the pn junctions 502 and 504 on either side of the same substrate. Standard fabrication processes used commonly by industry for manufacturing single junction CdTe and Si solar cells can be used in part to fabricate the pn junctions 502 and 504 separately.

The superstrate CdTe sub-cells strings 508 of FIG. 5 may be formed directly from CdTe pn junction 502. For example, the structure may include a front contact layer 522 that should be deposited or formed from a material with a higher bandgap than the CdTe pn junction 502 so that it is transparent to light absorbed in CdTe pn junction 502. For example, this material may include, but is not limited to, transparent conducting oxides. The front contact layer 522 is formed on transparent substrate 512, and may be isolated into front contacts for individual sub-cells via laser scribing or chemical etching. The CdTe pn junction 502 may be formed on top of the front contact layer 522. The pn junction of each sub-cell may then be isolated through laser scribing, chemical etching or other means, such that an opening to the front contact layer 522 is formed.

An electrically conducting back contact layer 520 may then be deposited on top of the CdTe pn junction 502 to form the back contact as well as the electrical connection to the front contact of the adjacent sub-cell when they are to be serially electrically connected to form sub-cell strings 508. The back contact layer 520 may consist of, but is not limited to, a heavily doped semiconductor or a transparent conducting oxide that is transparent to photons with energies less than the bandgap energy of the polycrystalline or amorphous thin film material that comprises the CdTe pn junction 502 of the superstrate CdTe sub-cell string 508. For example, this material may include, but is not limited to, transparent conducting oxides. The back contact layer 520 may then be isolated between sub-cells via laser scribing, chemical etching or other means. Metal grids may also be used in conjunction with or in place of the transparent back contact layer 520 to facilitate current collection from the top sub-cells. Metal contacts may also be used to connect adjacent sub-cells within a string. In a superstrate configuration, transparent substrate 512 protects the top sub-cells. Transparent substrate 512 could optionally incorporate a variety of photon recycling or light trapping configurations. Post-deposition treatments may also be applied at any time during the processing to passivate defects in the polycrystalline material and improve the overall performance of the CdTe sub-cells.

The Si lower sub-cells can be formed similarly, having front contact 524 and bottom contact 526. Once formed, the Si lower sub-cells are subsequently transferred and bonded to the CdTe upper sub-cell string, as described in further detail below with respect to FIGS. 6 and 8.

Figure 6:
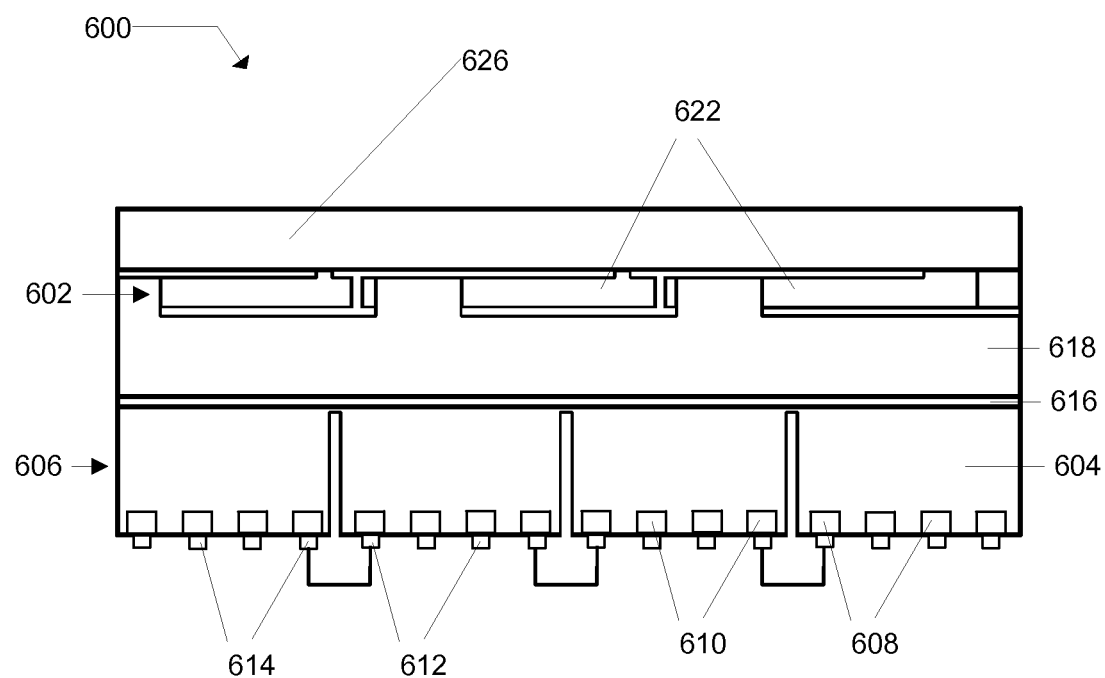
FIG. 6 is a schematic illustration of a tandem voltage-matched solar cell having CdTe p-n junction formed in a superstrate configuration with c-Si sub-cells formed in an interdigitated back contact configuration.

FIG. 6 illustrates a voltage-matched multijunction solar cell 600 having a CdTe sub-cell string 602 in a superstrate configuration, and bottom Si sub-cell string 606 formed in an interdigitated back contact (IBC) configuration. The solar cell 600 contains similar structures to solar cell 300 of FIG. 3 with the exception of the CdTe sub-cell string 602 being configured in a superstrate configuration, with transparent substrate 626 operationally positioned above the CdTe sub-cells.

Si sub-cell string 606 is formed independently of CdTe sub-cell string 602 from Si wafer 604. Si sub-cells are fabricated to have an IBC configuration. For example, sub-cell string 606 is formed in the lightly p-type (or n-type) doped Si wafer 604 using an all back or IBC configuration, in which all contacts are made on the back side of the Si wafer 604. For example, heavily n-type doped regions (or heavily p-type doped regions) 608 are patterned onto the backside of the Si wafer to form the emitter regions. Electrical connection to the lightly p-type doped (or lightly n-type doped) Si absorber region may also be facilitated though the patterning of local regions 610 of heavy p-type (or n-type) doping on the backside of the Si wafer as well.

Metal contacts 612 and 614 are formed in contact with the doped regions 608 and 610, respectively. Laser scribing, among other options, may be used to carry out sub-cell isolation. Texturing one or both sides of the Si wafer may be implemented to improve light absorption in the Si sub-cells. A heavily doped layer 616 with the same conductivity type as the lightly doped Si wafer may also be included on the top side of the Si wafer in order to reduce carrier recombination at that interface. This may also be achieved by processes including, but not limited to, dopant diffusion from Si inks, pastes or liquid dopant sources, ion implantation, or amorphous Si deposition.

Si sub-cell string 606 can subsequently be transferred and bonded to CdTe sub-cell string 602. In some embodiments, the Si sub-cell string 606 may be transferred and subsequently bonded to the transparent electrically insulating layer 618, or transparent electrically insulating layer 618 may be grown on the Si wafer 604 and bonded to CdTe sub-cell string 602. In some embodiments, transparent electrically insulating layer 618 may be an oxide grown on the Si wafer 604, which is then bonded to CdTe sub-cell string 602. In other embodiments, the transparent electrically insulating layer 618 may be a piece of plastic placed between the sub-cell strings 602 and 606. Any suitable means of physically connecting the two sub-cell strings 602 and 606 may be used. In one embodiment, CdTe sub-cell string 602 is bonded to Si sub-cell string 606 using polyethylene terephthalate.

CdTe sub-cell string 602 can be formed separately on transparent substrate 626 for implementation in a superstrate configuration, as described above with respect to FIG. 5, and as described below with respect to FIG. 8.

Figure 7:
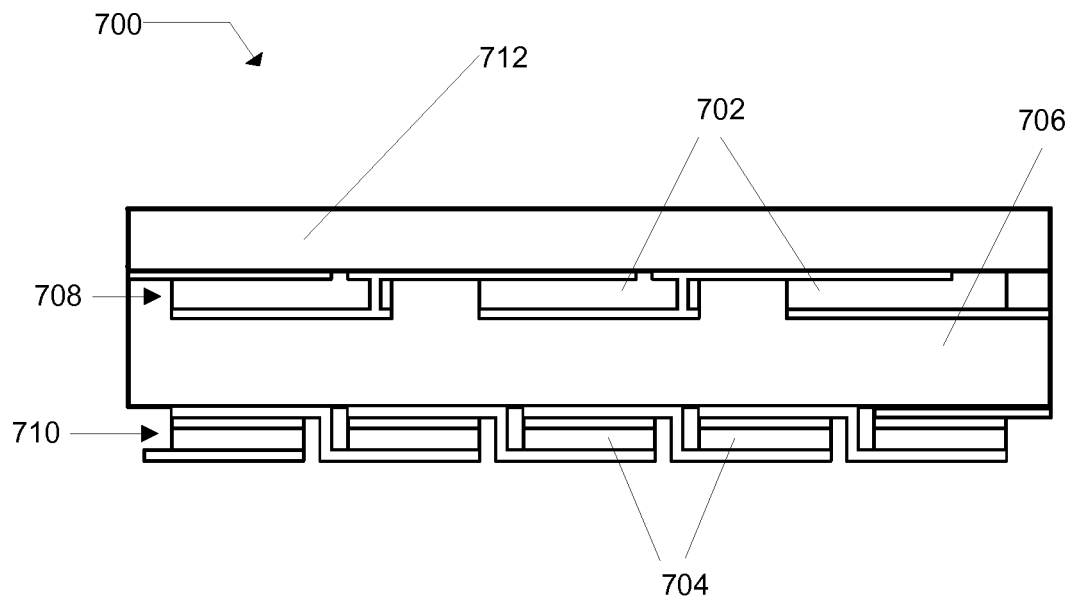
FIG. 7 is a schematic illustration of a tandem voltage-matched solar cell having a CdTe p-n junction formed in a superstrate configuration with c-Si bottom sub-cells formed from a thin c-Si layer.

FIG. 7 illustrates an alternative voltage-matched multijunction solar cell 700 having a CdTe sub-cell string 708 positioned in a superstrate configuration, and a thin c-Si sub-cell string 710 formed from a thin c-Si layer 704, typically but not exclusively less than 80 micrometers (µm) in thickness. These layer(s) 704 may be formed by any appropriate method. For example, in some embodiments, the layer(s) 704 are formed by sawing appropriately thin wafers from a Si boule. In yet other embodiments, c-Si layer(s) 704 may be formed by removing a thin layer directly from a Si boule by a kerfless method, depositing the crystalline layer(s) 704 from the gas or solid phase on a c-Si template and then removing the layer(s) 704 from the template through the use of an engineered "release layer." Alternatively, the crystalline layer(s) 704 may be deposited from a gas or solid phase precursor on a foreign crystalline template. The geometry of the thin c-Si sub-cells may be either in the conventional arrangement (front emitter, front and back contacts) or an IBC configuration.

The use of thin c-Si sub-cells has the advantage that less material is consumed, which has the potential to lower the cost of the module. Moreover, physical supporting for the thin c-Si sub-cell string 710 is provided by the CdTe superstrate sub-cell string 708. However, additional light trapping designs may also need to be incorporated to maximize light absorption in these thin c-Si sub-cells.

The CdTe sub-cells of device 700 are formed on a separate substrate 712. All electrical connections within the sub-cell string 708 in the CdTe pn junction layers 702 are fabricated on transparent substrate 712 before being combined with thin c-Si sub-cell string 710.

The CdTe sub-cells 702 and the c-Si sub-cells 704 are fabricated independently and/or in parallel before integration, thus preventing the sub-cells of one PV technology from being exposed to the processing conditions of the other.

Si sub-cell string 710 can subsequently be transferred and bonded to CdTe sub-cell string 708. In some embodiments, the Si sub-cell string 710 may be transferred and subsequently bonded to the transparent electrically insulating layer 706, or transparent electrically insulating layer 706 may be grown on the c-Si layer(s) 704 and bonded to CdTe sub-cell string 708. The transfer, bonding and other fabrication steps utilized to create the device 700 or other devices disclosed herein may be performed in any suitable order. In certain embodiments, some processing steps described herein may be eliminated or additional processing steps may be performed. In addition, in some embodiments additional processing or finishing steps may be performed after the upper and lower sub-cell strings have been transferred and bonded. In some embodiments, transparent electrically insulating layer 706 may be an oxide grown on the c-Si layer(s) 704. In other embodiments, the transparent electrically insulating layer 706 may be a piece of plastic placed between the sub-cell strings 708 and 710. In one embodiment, CdTe sub-cell string 708 is bonded to Si sub-cell string 710 using polyethylene terephthalate. The polyethylene terephthalate layer may also be used to physically support the Si layer(s) during the transfer process. Any suitable means of physically connecting the two sub-cell strings 708 and 710 may be used.

Figure 8:
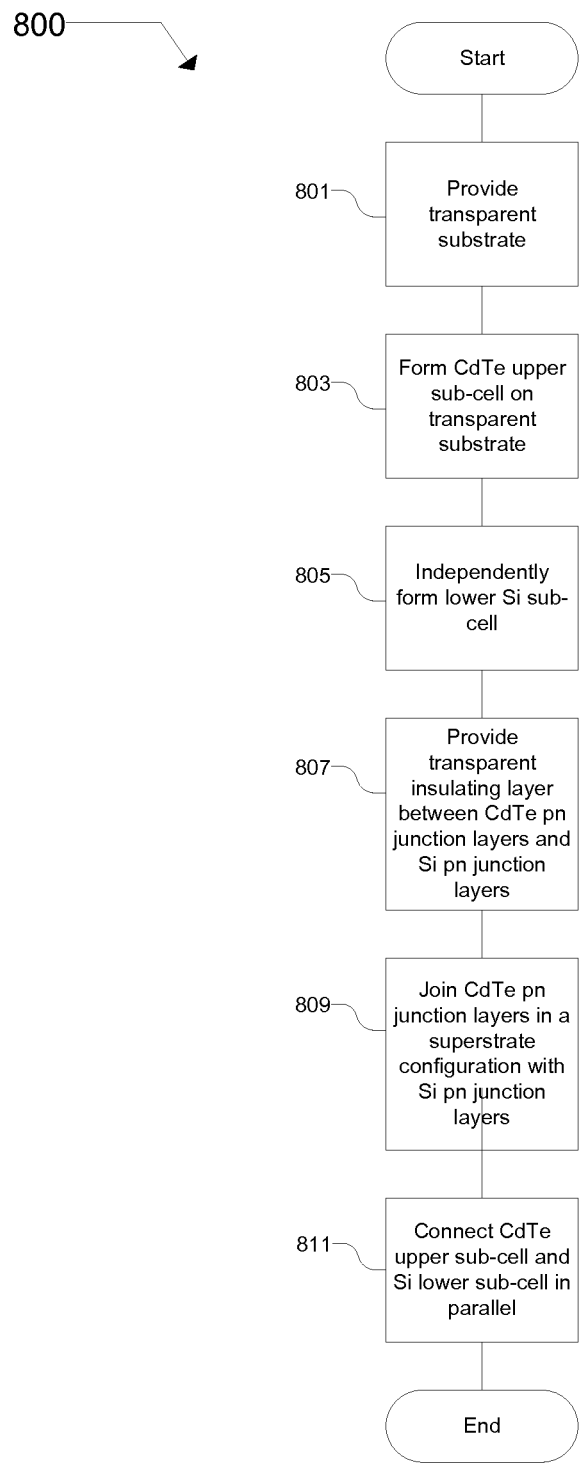
FIG. 8 is a flow diagram of an exemplary method of manufacturing a voltage matched solar cell having a CdTe sub-cells in a superstrate configuration with bottom c-Si sub-cells.

An exemplary method 800 of fabricating certain of the above embodiments is illustrated in FIG. 8. At block 801, a transparent substrate is provided. The transparent substrate may include, but are not limited to, a semiconductor wafer, glass, a polymer or another material which is optically transparent and which may be rigid or flexible. When operatively implemented in a superstrate configuration, the transparent substrate protects the top CdTe sub-cells. The transparent substrate could optionally incorporate a variety of photon recycling or light trapping configurations.

At block 803, CdTe upper sub-cells are formed on the transparent substrate. In one embodiment, the CdTe upper sub-cell may comprise a CdTe absorber layer and a CdS emitter layer. In various embodiments, in forming CdTe sub-cells, an electrically conducting front contact layer is deposited onto the substrate. The front contact should be deposited or formed from a material that has a higher bandgap than the CdTe pn junction so that it is transparent to light absorbed in CdTe pn junction. For example, this material may include, but is not limited to, transparent conducting oxides. The front contact layer may be isolated into front contacts for individual sub-cells via laser scribing or chemical etching. A CdTe pn junction is formed on top of the front contact layer. The pn junction of each sub-cell may then be isolated through laser scribing, chemical etching or other means, such that an opening to the front contact layer.

A back contact layer may be deposited on top of the CdTe pn junction to form the back contact as well as the electrical connection to the front contact of the adjacent sub-cell when they are to be serially electrically connected to form sub-cell strings. The back contact layer may include, but is not limited to, a heavily doped semiconductor or a transparent conducting oxide that is transparent to photons with energies less than the bandgap energy of the polycrystalline or amorphous thin film material that comprises the CdTe pn junction. The back contact layer may then be isolated between sub-cells via laser scribing, chemical etching or other means. Metal grids may also be used in conjunction with or in place of the back contact layer to facilitate current collection from the top sub-cells. Metal contacts may also be used to connect adjacent sub-cells within a string. Post-deposition treatments may also be applied at any time during the processing to passivate defects in the polycrystalline material and improve the overall performance of the CdTe sub-cells.

At block 805, lower Si sub-cells are formed independently of the CdTe upper sub-cells. That is, the Si sub-cells are formed in a separate process from the CdTe upper sub-cells and may be fabricated simultaneously and in parallel with the CdTe fabrication process.

In one embodiment, the Si lower sub-cells can be formed on a separate substrate. The lower Si sub-cells may be formed to have a front contact and bottom contact. In certain embodiments, the Si sub-cell string is formed from a Si wafer.

In various other embodiments, the Si sub-cell may be fabricated in an IBC configuration. For example, all electrical contacts may be made on the back side of the Si wafer. Heavily n-type doped regions (or heavily p-type doped regions) are patterned onto the backside of the Si wafer to form the emitter regions. Electrical connection to the lightly p-type doped (or lightly n-type doped) Si absorber region may also be facilitated though the patterning of local regions of heavy p-type (or n-type) doping on the backside of the Si wafer as well. Metal contacts may then be formed in contact with the heavily doped regions, respectively. Laser scribing, among other options, may be used to carry out sub-cell isolation.

In some further embodiments, a thin c-Si lower sub-cell may be formed from a thin c-Si layer, which is typically, but not exclusively, less than 80 micrometers (μm) in thickness. These layer(s) may be formed by any appropriate method, including, but not limited to, by sawing appropriately thin wafers from a Si boule, removing a thin layer directly from a Si boule by a kerfless method, depositing the crystalline layer(s) from the gas or solid phase on a c-Si template and then removing the layer from the template through the use of an engineered "release layer," or depositing from a gas or solid phase precursor on a foreign crystalline template. The geometry of the thin c-Si sub-cells may be either in the conventional arrangement (front emitter, front and back contacts) or an IBC configuration. In this embodiment, the Si lower sub-cells may be physically supported and/or reinforced by the CdTe upper sub-cells.

Texturing one or both sides of the Si wafer may be implemented to improve light absorption in the Si sub-cells. A heavily doped layer with the same conductivity type as the lightly doped Si wafer may also be included on the top side of the Si wafer in order to reduce carrier recombination at that interface. This may also be achieved by processes including, but not limited to, dopant diffusion from Si inks, pastes or liquid dopant sources, ion implantation, or amorphous Si deposition.

At block 807, a transparent insulating layer is provided between CdTe pn junction layers and the Si pn junction layers. In some embodiments, the insulating layer may consist of an un-doped semiconductor, oxide, nitride, polymer or other material with high electrical resistance and optical transparency at suitable wavelengths. High resistivity or isolating diodes can also be used for electrical isolation of the two stacked pn junctions.

In some embodiments, the Si sub-cells can be transferred and subsequently bonded to the transparent electrically a separate insulating layer, such as a piece of plastic such as polyethylene terephthalate. In other embodiments, the transparent electrically insulating layer may be grown on the Si wafer, for example as an oxide layer.

At block 809, the CdTe pn junction layers are joined to the Si pn junction layers, with the CdTe pn junction layers/sub-cells positioned in a superstrate configuration. Any suitable means of physically connecting the two pn junction layers/sub-cell strings may be used. In some embodiments, Si sub-cells can be transferred after fabrication, and subsequently bonded to the transparent insulating layer. In other embodiments, the transparent insulating layer may be grown on the Si sub-cells and the CdTe sub-cells subsequently bonded to the oxide transparent insulating layer in a superstrate configuration.

At block 811, the CdTe upper sub-cell strings and Si lower sub-cell strings are electrically connected in parallel to create a two terminal voltage-matched device. Thus, the total voltage of each CdTe upper sub-cell strings is equal to the total voltage of each Si lower sub-cell strings. It is important to note that in certain fabrication method embodiments, some processing steps described herein may be eliminated or additional processing steps may be performed. In addition, in some fabrication method embodiments, additional processing or finishing steps may be performed after the upper and lower sub-cell strings have been transferred and bonded.

Figure 9:
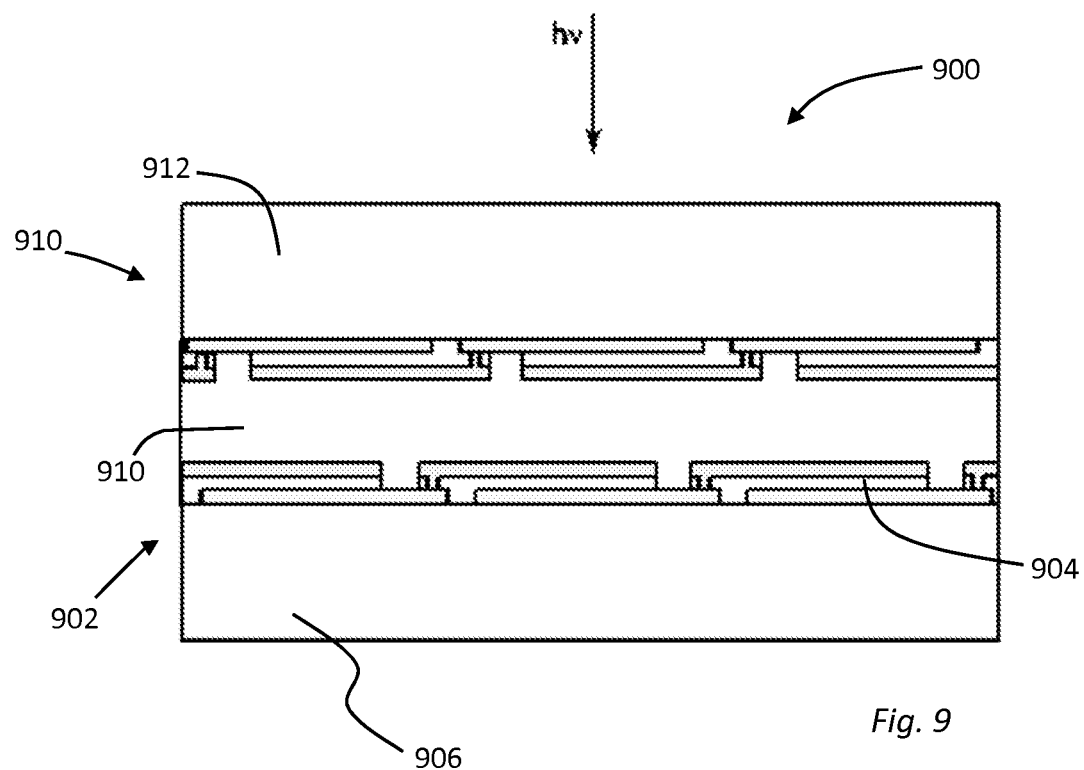
FIG. 9 is a schematic illustration of a tandem voltage-matched solar cell having a CdTe p-n junction formed in a superstrate configuration with a thin film bottom p-n junction.

In an alternative embodiment of voltage-matched multi-junction solar cell 900 illustrated in FIG. 9, the bottom sub-cells 902 may be formed from pn junctions 904 fabricated with thin film materials such as CIGS, CZTS, CIS or other suitable semiconductors. These bottom sub-cells 902 can be fabricated on any suitable substrate 906 using any deposition and sub-cell isolation methods. Any suitable method may also be used to serially connect the thin film bottom sub-cells 902 into strings. The bottom thin film sub-cells 902 can then be connected to the top CdTe sub-cells 908, fabricated as described above, via an intermediate, electrically insulating layer 910. Thus, the superstrate 912 of the top CdTe sub-cells 908 may support the bottom sub-cells 902 for post-stacking processing or finishing steps. Electrically insulating layer 910 could be a polyethylene terephthalate layer or some other plastic, or it could be an oxide deposited on one of the surfaces between the bottom and top sub-cells.

The description of the disclosed embodiments has been presented for purposes of illustration and description, but is not intended to be exhaustive or limiting of the claims to any particular form disclosed. The scope of the present disclosure is limited only by the scope of the following claims. Many modifications and variations will be apparent to those of ordinary skill in the art. The embodiments described and shown in the figures were chosen and described in order to best explain the principles of the various embodiments, the practical application, and to enable others of ordinary skill in the art to understand the various embodiments with various modifications as are suited to the particular use contemplated.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope of the disclosure. Various embodiments of the disclosure could also include permutations of the various elements recited in the claims as if each dependent claim was a multiple dependent claim incorporating the limitations of each of the preceding dependent claims as well as the independent claims. Such permutations are expressly within the scope of this disclosure.

What is claimed is:

1. A voltage-matched multijunction solar cell comprising:
    a CdTe pn junction layer comprising a CdTe upper sub-cell;
    a lower pn junction layer comprising a lower sub-cell;
    a transparent insulating layer positioned between the CdTe pn junction layer and the lower pn junction layer;
    a transparent superstrate positioned opposite the CdTe pn junction layer from the transparent insulating layer; and
    an interdigitated p-type and n-type back contact comprising Si and associated with the lower sub-cell on the side of the lower sub-cell opposite the transparent insulating layer,
    wherein the CdTe upper sub-cell and the lower sub-cell are voltage-matched and are connected to each other in parallel.

2. The voltage-matched multijunction solar cell of claim 1, wherein the lower pn junction layer comprises Si.

3. The voltage-matched multijunction solar cell of claim 2, further comprising:
    a transparent first front contact and a transparent first back contact associated with the CdTe upper sub-cell, wherein the transparent first back contact is positioned between the transparent insulating layer and the CdTe upper sub-cell.

4. The voltage-matched multijunction solar cell of claim 1, wherein the lower pn junction layer is crystalline and has a thickness equal to or less than 80 micrometers.

5. The voltage-matched multijunction solar cell of claim 1, wherein:
    the CdTe upper sub-cell comprises at least one of single crystalline or polycrystalline CdTe, and
    the lower sub-cell comprises at least one of single crystalline or polycrystalline Si.

6. The voltage-matched multijunction solar cell of claim 1, wherein the CdTe pn junction layer comprises a CdTe absorber layer and a CdS emitter layer.

7. The voltage-matched multijunction solar cell of claim 1, wherein:
    the CdTe pn junction layer comprises a first string of serially connected CdTe upper sub-cells,
    the lower pn junction layer comprises a second string of serially connected lower sub-cells, and
    the first string and the second string are voltage-matched and are connected to each other in parallel.

8. The voltage-matched multijunction solar cell of claim 1, wherein the transparent insulating layer comprises an oxide grown on the lower pn junction layer.

9. The voltage-matched multijunction solar cell of claim 1, wherein the transparent superstrate comprises glass.

10. A method of fabricating a voltage-matched multijunction solar cell, the method comprising:
    forming a CdTe upper sub-cell within a CdTe pn junction layer on a transparent substrate;
    forming a lower sub-cell within a lower pn junction layer;
    providing a transparent insulating layer between the CdTe pn junction layer and the lower pn junction layer;
    forming an interdigitated p-type and n-type back contact comprising Si and associated with the lower sub-cell on the side of the lower sub-cell opposite the transparent insulating layer;
    subsequently joining the CdTe pn junction layer and the lower pn junction layer such that the transparent substrate is positioned in a superstrate configuration; and
    connecting the CdTe upper sub-cell and the lower sub-cell to each other in parallel, wherein the CdTe upper sub-cell and the lower sub-cell are voltage-matched.

11. The method of claim 10, wherein the lower pn junction layer comprises Si.

12. The method of claim 11, further comprising:
    forming a transparent first front contact and a transparent first back contact associated with the CdTe upper sub-cell, wherein the transparent first back contact is positioned between the transparent insulating layer and the CdTe upper sub-cell.

13. The method of claim 10, further comprising:
    forming a transparent first front contact and a transparent first back contact associated with the CdTe upper sub-cell, wherein the transparent first back contact is positioned between the transparent insulating layer and the CdTe upper sub-cell; and
    forming a transparent second front contact and a transparent second back contact associated with the lower sub-cell, wherein the transparent second front contact and the transparent second back contact are formed on opposite sides of the lower pn junction layer.

14. The method of claim 10, wherein:
    the lower sub-cell is physically supported by the transparent substrate, and
    the lower pn junction layer is crystalline and has a thickness equal to or less than 80 micrometers.

15. The method of claim 10, wherein the CdTe pn junction layer comprises a CdTe absorber layer and a CdS emitter layer.

16. The method of claim 10, further comprising:
    forming a first string of serially connected CdTe upper sub-cells within the CdTe pn junction layer;
    forming a second string of serially connected Si lower sub-cells within the lower pn junction layer; and
    connecting the first string and the second string to each other in parallel.

17. The method of claim 10, wherein providing the transparent insulating layer comprises forming an oxide on the lower pn junction layer.

18. The method of claim 10, wherein providing the transparent insulating layer comprises bonding a first side of a standalone insulating layer to the CdTe pn junction layer and bonding a second side of the standalone insulating layer opposite the first side to the lower pn junction layer.

19. The method of claim 10, wherein the transparent insulating layer comprises polyethylene terephthalate.

* * * * *